United States Patent [19]

Soltysik et al.

[11] 4,388,719

[45] Jun. 14, 1983

[54] DYNAMIC SIGNAL GENERATOR

[75] Inventors: George E. Soltysik, Russell, Pa.; John C. R. Anderson, Jamestown, N.Y.

[73] Assignee: Loranger Manufacturing Company, Warren, Pa.

[21] Appl. No.: 225,673

[22] Filed: Jan. 16, 1981

[51] Int. Cl.³ .................. G06F 11/00; G01R 31/28
[52] U.S. Cl. .............................. 371/27; 324/73 R
[58] Field of Search ........... 371/27; 324/73 R, 73 AT

[56] References Cited

U.S. PATENT DOCUMENTS

| 4,263,669 | 4/1981 | Staiger ................................. 371/27 |
| 4,293,950 | 10/1981 | Shimizu et al. ............... 324/73 R X |
| 4,316,259 | 2/1982 | Albrecht et al. ................ 371/27 X |
| 4,335,457 | 6/1982 | Early ........................... 324/73 R X |

OTHER PUBLICATIONS

Legnard et al., "Pattern Generating System", *IBM Technical Disclosure Bulletin*, vol. 14, No. 2, Jul. 1971, pp. 482-484.
Belyeu, "Bit Programmable Pattern Generator", *IBM Tech. Disclosure Bulletin*, vol. 21, No. 3, Aug. 1978, pp. 897-901.

*Primary Examiner*—David H. Malzahn
*Attorney, Agent, or Firm*—Charles L. Lovercheck; Wayne L. Lovercheck; Dale R. Lovercheck

[57] ABSTRACT

A dynamic signal generating circuit for exercising semiconductors and other electronic devices and circuits which includes first and second address selectors, first and second PROM address counters connected to said first and second address selectors respectively, first and second interval timer PROMs connected to said first and second address counters respectively, first and second output signal PROMs connected to said first and second interval PROMs respectively and means to connect said first output signal PROMs through clock and address drivers to a device under test and means to connect said second output signal PROMs through clock drivers to said device being tested and means connecting said first output PROMs through data drivers to said device being tested whereby said circuit controls a dynamic signal pattern system for exercising said semiconductors or other electronic devices and circuits.

7 Claims, 1 Drawing Figure

DYNAMIC SIGNAL GENERATOR

GENERAL DESCRIPTION OF THE INVENTION

In the field of electronics, there exists a failure phenomena of electronic devices called "Infant Mortality" during which devices fail after only a short period of operation time. It is possible to sort out those devices which may fail prematurely before they are installed in an electronic circuit by subjecting them to a process called "Burn-in." This process consists of stressing the devices for a short period of time thermally, statically using voltage biasing, and/or dynamically using multiple signal patterns to exercise the devices. The devices which fail during the "Burn-in" process are then sorted out of the population.

Because of the variety of electronic devices on the market today, a "Burn-in" system and, in particular, the dynamic signal set must be very flexible in order to produce the test conditions and signal patterns unique to each device.

In developing the previously described concept of generating signals for the dynamic exercise of semi-conductor devices, programmable read only memories (PROMs) have been chosen to reduce the concept to actual practice. A partial, but not all inclusive listing of alternate devices which will also operate in a manner similar to that of the PROMs are:
1. Random Access Memories (RAMs)
2. Read Only Memories (ROMs)
3. Erasable Programmable Read Only Memories (EPROMs)
4. Transistor-Transistor-Logic Devices (TTL)
5. Switches or Diode Matrices and Multiplexers
6. Electrically Alterable Programmable Read Only Memories (EAPROMs)
7. Microprocessors
8. Field Programmable Arrays (FPA)
9. Parallel Array Logic (PAL)
10. Shift Registers
11. Delay Lines
12. Magnetic Storage Devices The purpose of this invention is to document a novel technique for producing dynamic signal patterns through the use of Programmable Read Only Memories (PROMs) on what we will refer to hereafter as the dynamic signal card set. Specifically, this dynamic signal card set is able to:

1. Generate a wide frequency range of signals from the Megahertz range down to signals in the hertz range.
2. Supply a wide range of pulse widths (from 100 nanoseconds minimum to 0.1 second maximum per PROM memory word) and duty cycles (0.00001% to 99.9999%). Furthermore, additional developments on this circuit have reduced the minimum pulse width to 50 nanoseconds now, with research currently being conducted to go even lower.
3. Produce very "fast" and very "slow" signals simultaneously.
4. Readily switch from one set of dynamic signals being generated for one type of semiconductor device to another completely different set of signals for a completely different type of device.

The unique way that PROMs are used as interval timers and as signal generators as described in this patent application combine to provide a dynamic signal card set which is capable of "Burning-in" most electronic devices on the market today. Note: The above discussion refers to the receiving object of the dynamic signal pattern output as being semiconductor devices. Although this is a primary interest, the signal patterns can be used to exercise almost any electronic device or circuit that fits the constraints of the design.

GENERAL DESCRIPTION OF THE DRAWINGS

FIG. 1 is a block diagram of the circuit according to the invention.

DETAILED DESCRIPTION OF THE DRAWINGS

Figure 1:
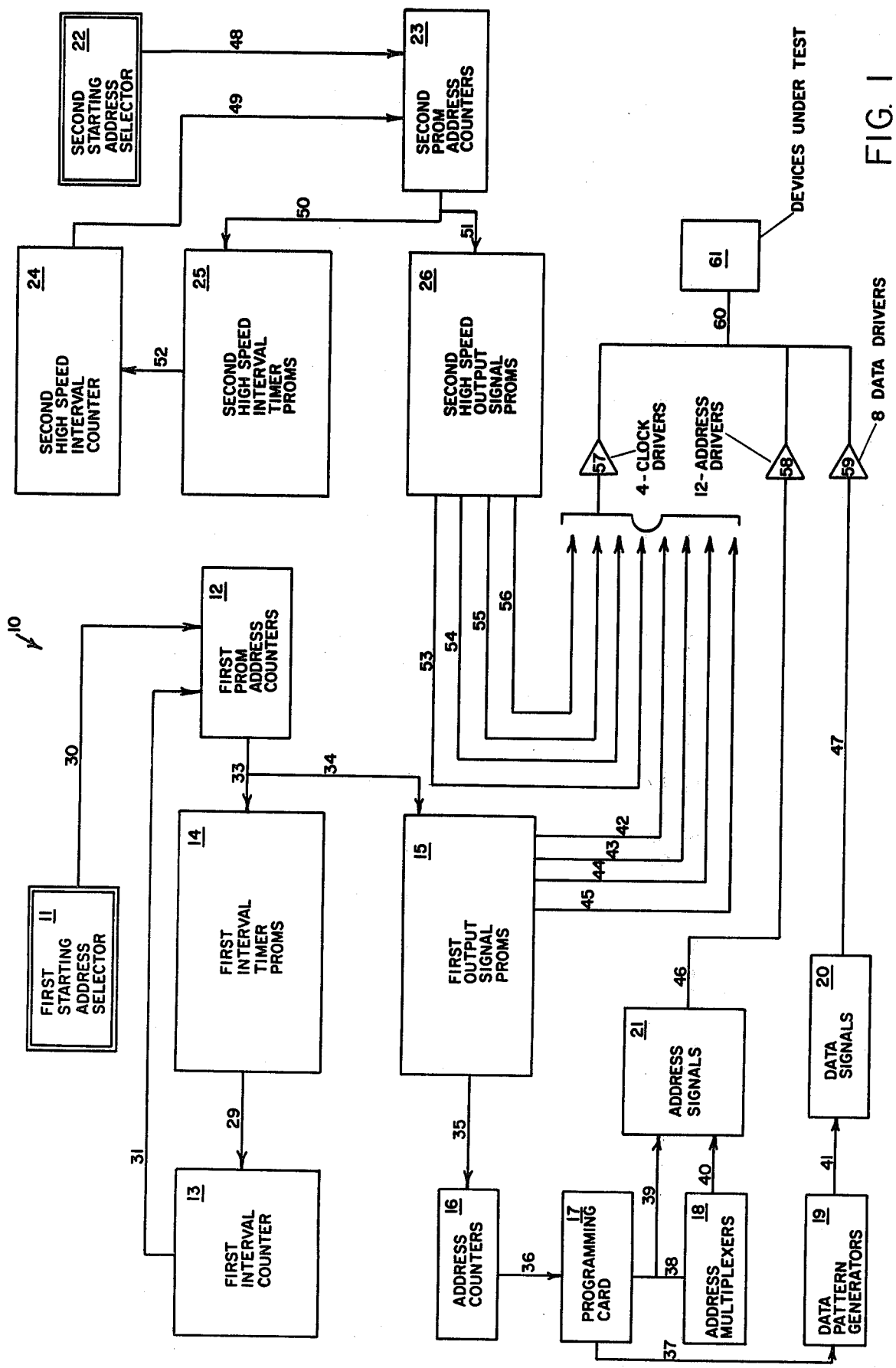

Now with more particular reference to the drawings, a block diagram of the PROM Dynamic Signal Card Set is indicated generally at 10 wherein a first starting address selector 11 is connected through line 30 to first PROM address counters 12.

Interval counter 13 is likewise connected to first PROM address counters 12 through line 31. The first PROM address counters 12 are connected through lines 33 and 34 to interval timer PROMs 14 and output signal PROMs 15 respectively. Interval timer PROMs 14 are connected to the interval counter 13 through line 29.

Output signal PROMs 15 are connected through lines 35 to address counters 16 which are in turn connected to the programming card 17 through line 36. Programming card 17 is connected through line 37 to data pattern generators 19, and programming card 17 is likewise connected through lines 38 and 39 to address multiplexers 18 and address signals 21 respectively. Address multiplexers 18 are likewise connected through line 40 to address signals 21. Data pattern generators 19 are connected through line 41 to the data signals 20.

The output signal PROMs 15 are connected through lines 42, 43, 44 and 45 to clock drivers. Address signals 21 are connected to address drivers through line 46 and the data signals 20 are connected through line 47 to data drivers.

In addition to the interval timer section previously described, there exists another timer section which operates in a similar manner to the interval timer. It consists of a starting address selector 22 which is connected through line 48 to PROM address counters 23.

High speed interval counter 24 is likewise connected to PROM address counters 23 through line 49. The PROM address counters 23 are connected through lines 50 and 51 to high speed interval timer PROMs 25 and high speed output signal PROMs 26 respectively. High speed interval timer PROMs 25 are connected to the high speed interval counter 24 through line 52. High speed output signal PROMs 26 are connected to the clock drivers through lines 53, 54, 55, and 56.

The drivers referenced by 42, 43, 44, 45, 46, 47, 53, 54, 55 and 56 are actually separate circuits made up of various electronic components. Each driver is designed to be powerful enough to deliver the signal that is at its input to a large parallel array of devices 61 to be burned in.

The clock drivers 57, address drivers 58, and data drivers 59 are connected through lines 60 to the devices under test 61.

The circuits outlined in FIG. 1 can be supported on a set of printed circuit boards. In order to program the PROMs in the dynamic set shown in FIG. 1, the following step-by-step procedure is recommended.

The areas of the circuit which contain PROMs are the interval times and the interval timers output signal PROMs.

The following programming procedure should be followed in programming the circuit:

STEP 1. Draw an accurate drawing of the desired output waveforms with special care taken to insure exact timing relationships between the signals. This should be done until one complete cycle of the *slowest* waveform is drawn.

STEP 2. Divide the signals into "word groups" by connecting a line through every transition of each signal down to the time axis on the drawing.

STEP 3. Select a point where most of the signals have a common transition and label this the zero time reference (T=0).

STEP 4. From the T=0 point chosen in Step 3, locate one cycle of the *slowest* waveform drawn and label this point T=0 also.

STEP 5. Draw in below the signal output waveforms a new signal called Program Return (PR). This signal is low during all the "groups" (see Step 2) but goes high only in the "word group" just before the second T=0 point. The purpose of the PR signal is to tell the PROM program to return to the starting word.

STEP 6. Label the transitions in nanoseconds from the T=0 point.

STEP 7. Choose a starting word location in the PROMs and assign this word to the "word group" just after the first T=0 point. Then assign in consecutive order a PROM word location to each "group" until the second T=0 point is reached. The word locations here can be listed in decimal notation.

STEP 8. Make a chart showing the PROM word location and the Time Interval (TI) associated with each word in nonoseconds.

STEP 9. Divide the Time Interval by 100 to get a set of numbers which are now to be manipulated in either the Interval Timer or in the High Speed Interval Timer sections.

STEP 10. For the Interval Timer, subtract the set of numbers obtained in Step 9 from one million to get a six digit number which is ready to be programmed into PROMs 14 timing board. The least significant digit goes into the first PROM and most significant digit goes into the last PROM of PROMs 14. After making a chart showing PROM word location, PROM IC number, and the results of the subtraction, the PROMs are ready to be blown. It is helpful at this time to convert the word location, which is now in decimal form, to a HEX notation. PROM record sheets and decimal to HEX conversion charts may be designed to be used for this purpose.

STEP 11. Each PROM of the output signal PROMs 15 has four outputs labeled Q0, Q1, Q2 and Q3 which must now be assigned to the waveforms drawn in Step 1. The output assignment at this point is arbitrary.

STEP 12. Make a chart of PROM word location versus waveform state for *each* PROM output. By convention, we use a logic level "0" to be a "low" state and a logic level "1" to be a "high" state. Note that all the unused outputs of PROMs 15 are to be assigned to their unprogrammed state.

STEP 13. Shift all the information in the charts of step 12 up to the next higher word location and reassign the last word's information down to the starting word location used in this exercise. EXCEPTION: The Program Return *does not* get shifted but remains the same programmed with a 1 in the last word of this program.

STEP 14. Convert the four bit binary code on the Q3, Q2, Q1, and Q0 outputs of PROMs 15 to a hexadecimal number for each word location used.

STEP 15. Convert the decimal word location to a HEX number and transfer the information from steps 14 and 15 onto the PROM program record sheets. These PROMs are now ready to be blown.

The high speed (second) interval timer PROMs are used in specifications which require some signals in the 50 kilohertz to 5 megahertz range, referred to herein as high speed, as well as some signals in the 1 hertz to 50 kilohertz range. This high speed timer saves adding a significant amount of PROM memory circuitry which would normally be required if all signals were put into the first interval timer, which accommodates the complete range from 1 hertz to 5 megahertz. This high speed timer operates in a similar manner to the first interval timer but has a smaller operating range. Therefore, the slow signals are programmed in the first interval timer as described previously while the fast signals are programmed in the high speed interval timer as follows:

1. Follow steps 1 through 9 as described.

2. In Step 10, subtract the numbers obtained in Step 9 from one hundred instead of from one million. This gives a two digit number which is ready to be programmed into the PROMs of high speed interval timer PROMs 25. The least significant digit goes into the first and the last PROMs of PROMs 25.

3. Follow Step 11 as before except that the output PROM here is PROM 26 and a Program Return signal exclusively for second high speed interval timer must be assigned to the Q0 of PROMs 26.

4. Note: This second High Speed section has its own set of starting address selectors.

OPTIONAL PROM PROGRAMMABLE SIGNALS AVAILABLE

Often other signals which are needed to perform special functions must also be generated by the output PROMs. Some of these are:

1. Address Increment (AI)

This signal is normally "high" but goes low during the word location just before the time which the address counters are to increment. It often looks like the inverse of the Program Return, but this is not always the case. For example, the user may require the address counter to increment several times before the Program Return signal is to appear. Note that this AI signal is also used to generate data patterns for the data drivers as well as to produce an Automatic reset signal feeding the drivers. If the AI signal is not needed, the user should then connect the PR signal already present to the AI PROM buffer. This is required to simplify the initial driver board set up when any driver monitor options are present. The AI signal must always be generated in the Interval Timer Section and not in the high speed timer section.

2. Address Multiplex (18)

This signal is PROM programmable to appear whenever desired during the output signal timing sequence. It is the signal which determines whether either straight-through or multiplexed addresses are fed out to the address drivers into the devices undergoing Burn-in.

3. Tri-State Control

The purpose of this signal is to tri-state the data drivers anywhere during the timing sequence. This feature permits the dynamic signal generator to "Tri-State on Demand" all data drivers and is very important during the Burn-in of microprocessors and other devices using a common data bus to both "read-out" and "write-in" data. This signal is normally "high", but goes "low" to cause the drivers to tri-state.

4. Rise-Time Strobe

This PROM programmable signal is used in conjunction with the Rise Time and Level Driver Monitor option. A "high" enables the Vtl and Vth transition monitors to operate while a "low" turns them off. Refer to the description of this Driver Monitor option for a more complete explanation of this feature.

The foregoing specification sets forth the invention in its preferred, practical forms but the structure shown is capable of modification within a range of equivalents without departing from the invention. Therefore, it is to be understood that these possible modifications do not alter the basic invention.

The embodiments of the invention in which an exclusive property or privilege is claimed are defined as follows:

1. A dynamic signal generating circuit for semiconductors comprising:
   a first starting address selector 11 and a second starting address selector 22,
   a first address counter means 12 and second address counter means 23,
   first interval counter means 13 and second interval counter means 24,
   first interval time means 14 and second interval time means 25,
   first output signal means 15 and second output signal means 26,
   an address counter 16,
   a programming card 17,
   address multiplexers 18,
   address signal means 21,
   data pattern generators 19, and
   data signal means 20,
   clock drivers 57,
   address drivers 58,
   data driver means 59,
   said starting address selectors 11 and 22 being connected to said first address counter means 12 and said second address counter means 23 respectively,
   said first address counter means 12 being connected to said first interval timer means 14 and to said first output signal means 15 respectively,
   said first interval timer means 14 being connected through said first interval counter 13 to said first address counter means 12,
   said second address counter means 23 being connected through said second interval timer means 25 to second interval counter means 24, said second address counter means 23 being also connected to said second output signal means 26,
   said second interval timer means 25 being connected through said second interval counter 24 to said second address counter 23,
   said first output signal means 15 being connected through said address counter means 16 to said programming card 17,
   said programming card 17 being connected to said data pattern generators 19, to said address multiplexers 18, and to said address signal means 21,
   said address multiplexers 18 being connected to said address signal means 21,
   said data pattern generator 19 being connected to said data signal means 20 and then connected through said data drivers means 59 to devices under test,
   said address signal means 21 being connected through address drivers 58 to said device under test,
   said first output signal means 15 and said second output signal means 26 being adapted to be connected through said clock drivers 57 to said device under test whereby a wide range of frequency and amplitude and intervals of signals is adjusted in said circuit and it is adapted to provide at least ten signals of all extremes at one time and to change from said ten signals to any one of different characters instantaneously.

2. A dynamic signal generating circuit for semiconductors comprising a first starting address selector means 11 and a second starting address selector 22, first address counter means 12 and second address counter means 23, first interval timer means 14, first interval counter means 13, second interval timer means 25, second interval counter means 24, and first output signal means 15, and second output signal means 26,
   an address counter 16,
   a programming card 17,
   address multiplexers 18,
   address signal means 21,
   data pattern generators 19, and
   data signal means 20,
   clock drivers 57,
   said starting address selector means 11 and 22 being connected to said first and second address counters means 12 and 23 respectively,
   said first interval timer means 14 being connected to said first address counter means 12,
   said first interval counter 13 being connected to said first interval timer 14 and to said first address counter means 12,
   said first output signal means 15 being connected through said first address counter means 12 and said first interval timer means 14,
   said second interval timer means 25 being connected to said second address counter means 23,
   said second interval counter 24 being connected to said second interval timer means 25 and to said second address counter means 23,
   said second output signal means 26 being connected to said second address counter means 23 and second interval timer means 25,
   first connecting means 42–45 and 53–56 adapted to connect said output signal means 15 and 26 directly to said clock drivers 57 and second connecting means 16–21 adapted to connect said first output signal means 15 to address drivers,
   whereby said circuit controls a dynamic signal pattern in a device to be tested.

3. The combination recited in claim 2 wherein said second connecting means comprises an address counter (16).

4. The dynamic signal generating circuit recited in claim 2 wherein said first connecting means 42–45 comprises a direct connection.

5. The circuit recited in claims 2, or 4 wherein said second connecting means comprises a programming card (17).

6. The circuit recited in claim 5 wherein said second connecting means comprises data pattern generators 19 connected to said programming card.

7. A dynamic signal generating circuit for semiconductors comprising,
- a first and second address selector (11,22),
- first and second address counters (12,23),
- first and second interval counters (13,24),
- first and second interval timer proms (14,25),
- first and second output signal proms (15,26),
- said first and second address selectors (11,22) being connected to said first and second address counters (12,23) respectively,
- said first and second interval counters (13,24) being connected to said first and second address counters (12,23) respectively,
- said first and second address counters (12,23) being connected to said first and second interval timer proms (14,25) respectively and to said first and second output signal proms (15,26) respectively,
- clock drivers (57),
- said first and second output signal proms (15,26) being connected to said clock drivers (57),
- and first circuit means (16, 17, 18, 21) connecting said first output signal proms to address drivers (57),
- and second circuit means (19,20) connecting said first circuit means to data drivers and means connecting said clock drivers, said address drivers, and said data drivers to a device under test.

* * * * *